United States Patent
Kitamura et al.

(10) Patent No.: US 8,106,475 B2
(45) Date of Patent: Jan. 31, 2012

(54) SEMICONDUCTOR DEVICE AND METHOD OF MANUFACTURING THE SAME

(75) Inventors: Yoshinori Kitamura, Tsu (JP); Koichi Matsuno, Mie-gun (JP); Kazunori Nishikawa, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 854 days.

(21) Appl. No.: 12/142,869

(22) Filed: Jun. 20, 2008

(65) Prior Publication Data

US 2008/0251883 A1 Oct. 16, 2008

Related U.S. Application Data

(62) Division of application No. 11/445,373, filed on Jun. 2, 2006, now Pat. No. 7,402,499.

(30) Foreign Application Priority Data

Jun. 2, 2005 (JP) ................................ 2005-162884

(51) Int. Cl.
 *H01L 21/76* (2006.01)
 *H01L 21/762* (2006.01)
(52) U.S. Cl. ......... 257/510; 257/513; 257/523; 438/424
(58) Field of Classification Search .................. 438/424, 438/427, 429, 435; 257/510, 513, 523
 See application file for complete search history.

(56) References Cited

U.S. PATENT DOCUMENTS

| | | | |
|---|---|---|---|
| 6,245,641 B1 | 6/2001 | Shiozawa et al. | |
| 6,995,095 B2 | 2/2006 | Yu | |
| 7,033,908 B2 | 4/2006 | Cha et al. | |
| 7,122,443 B2 | 10/2006 | Yang | |
| 7,176,105 B2 | 2/2007 | Nemani et al. | |
| 7,238,587 B2 * | 7/2007 | Hoshi et al. | 438/424 |
| 7,538,047 B2 * | 5/2009 | Kawasaki et al. | 438/787 |
| 7,598,151 B2 * | 10/2009 | Hoshi et al. | 438/424 |
| 7,682,927 B2 * | 3/2010 | Hoshi et al. | 438/424 |
| 2004/0126986 A1 | 7/2004 | Wise et al. | |
| 2005/0009293 A1 | 1/2005 | Kim et al. | |
| 2005/0074948 A1 | 4/2005 | Ko et al. | |
| 2005/0142801 A1 * | 6/2005 | Lee | 438/424 |
| 2006/0043456 A1 | 3/2006 | Derderian et al. | |
| 2006/0046425 A1 | 3/2006 | Sandhu | |
| 2007/0224749 A1 * | 9/2007 | Hoshi et al. | 438/197 |

FOREIGN PATENT DOCUMENTS

| | | |
|---|---|---|
| JP | 59-135743 A | 8/1984 |
| JP | 11-307626 | 11/1999 |
| JP | 2000-12678 A | 1/2000 |
| JP | 2003-31650 A | 1/2003 |
| JP | 2005-150500 A | 6/2005 |
| JP | 2006-269899 A | 10/2006 |

* cited by examiner

OTHER PUBLICATIONS

Japanese Office Action issued on Apr. 12, 2011 in corresponding Japanese Application No. 2005-162884 (with an English Translation).

*Primary Examiner* — Fernando L Toledo
(74) *Attorney, Agent, or Firm* — Oblon, Spivak, McClelland, Maier & Neustadt, L.L.P.

(57) ABSTRACT

A semiconductor device includes a semiconductor substrate formed with a plurality of first element isolation trenches having respective first opening widths and a plurality of second element isolation trenches having larger opening widths than the first opening widths, element isolation insulating films buried in the first element isolation trenches so that upper parts of the trenches have partial openings, respectively and buried in the second element isolation trenches respectively, and coating type oxide films formed so as to fill the openings of the first element isolation trenches, respectively. The coating-type oxide films are not buried in the second element isolation insulating trenches.

11 Claims, 17 Drawing Sheets

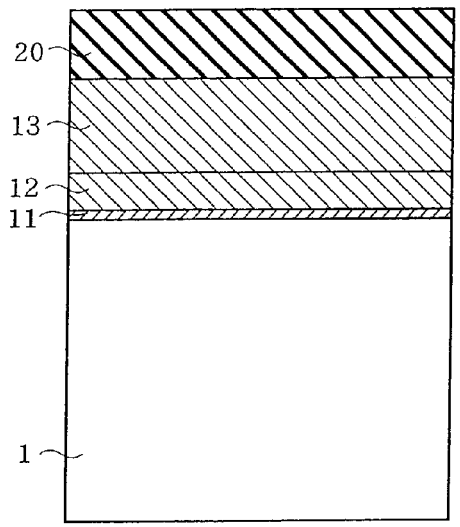
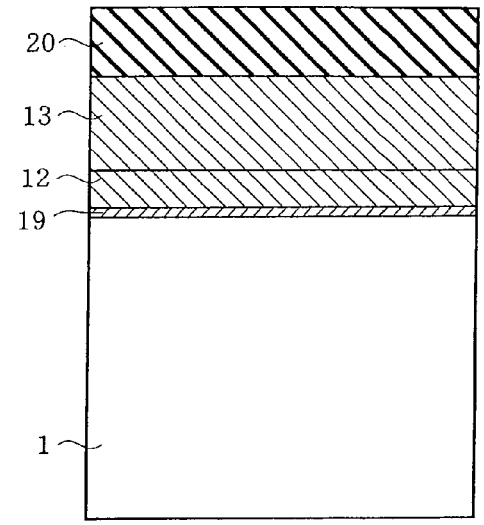
FIG. 3A          FIG. 3B
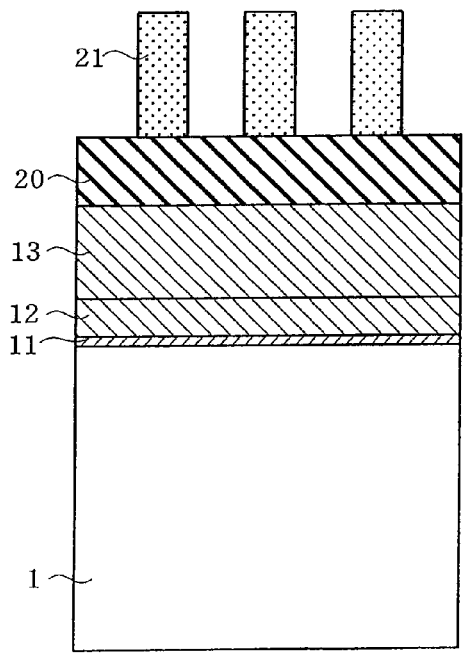
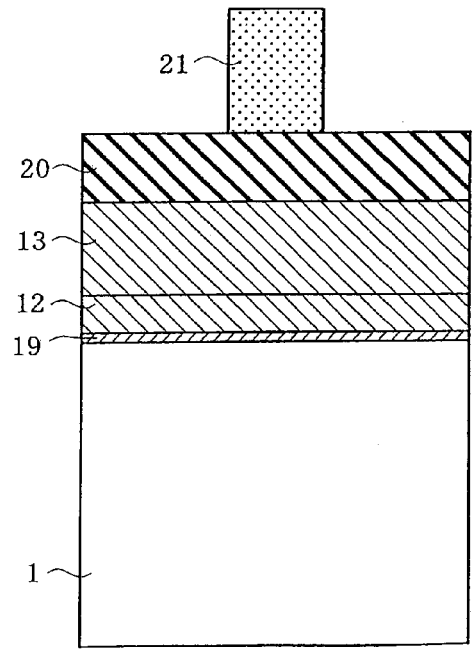
FIG. 4A          FIG. 4B

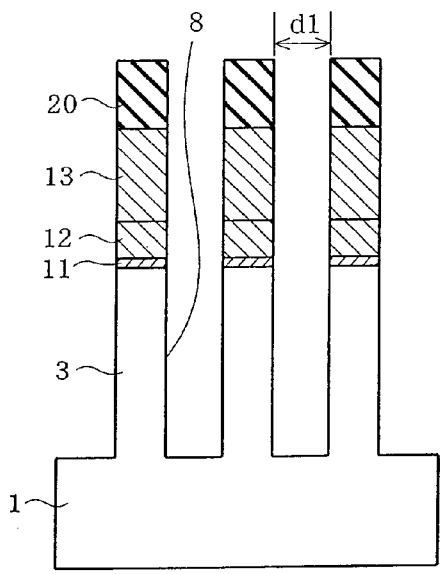
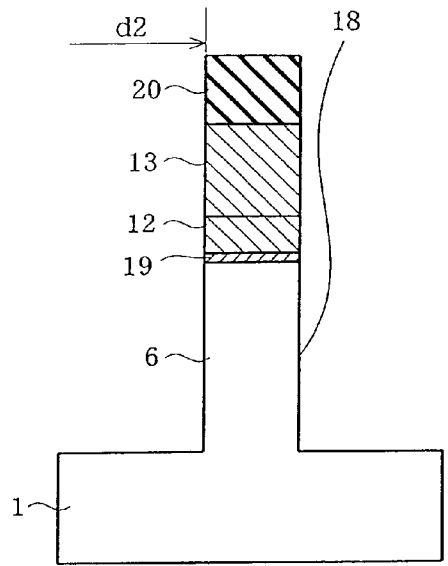
FIG. 5A  FIG. 5B
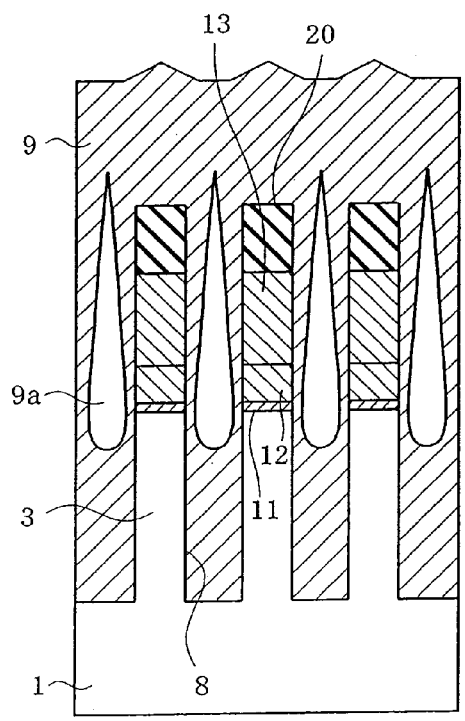
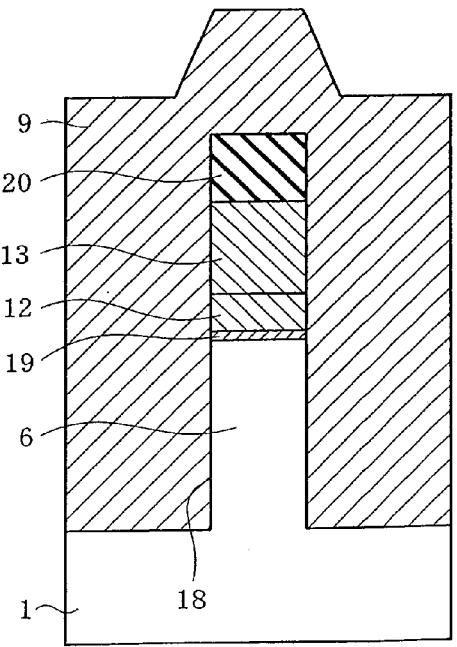
FIG. 6A  FIG. 6B

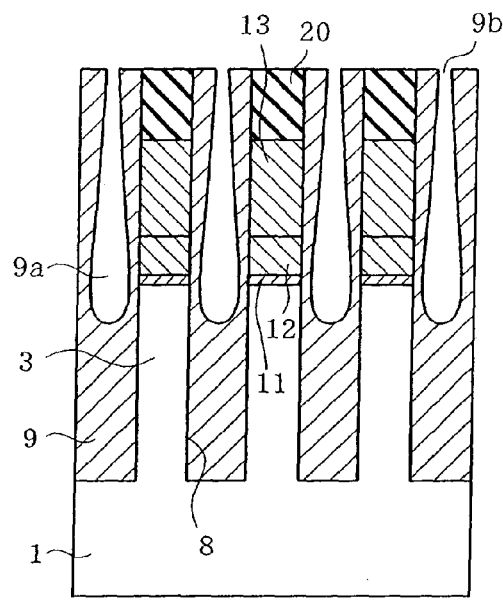 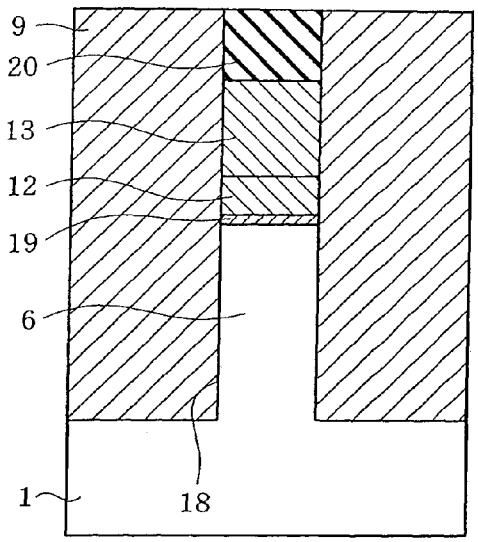
FIG. 7A          FIG. 7B
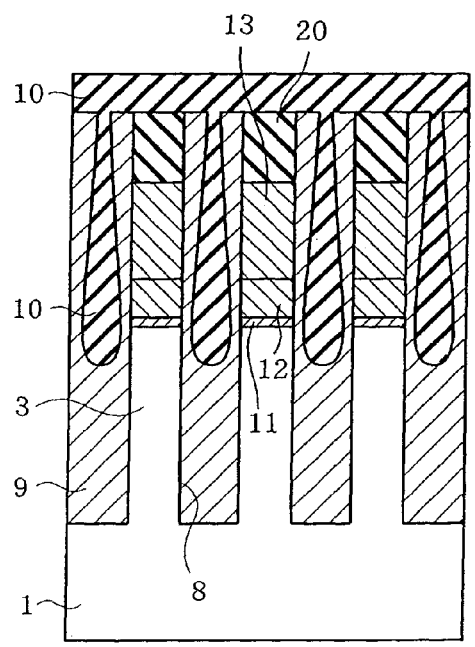 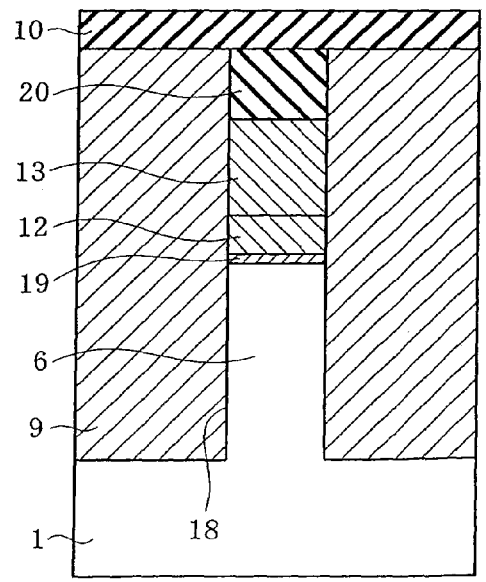
FIG. 8A          FIG. 8B

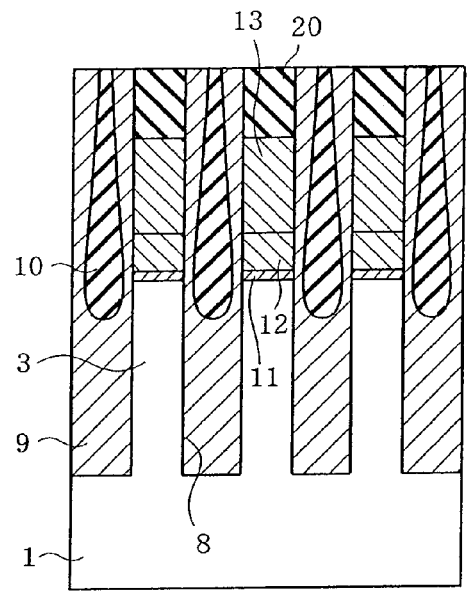
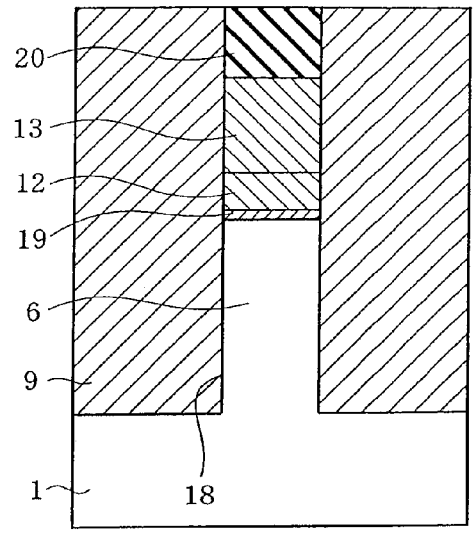
FIG. 9A    FIG. 9B
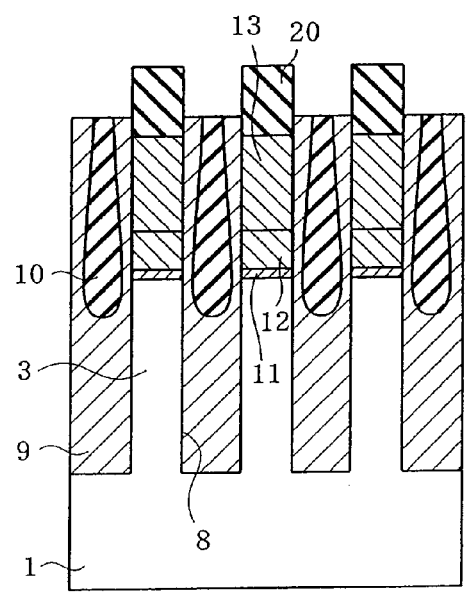
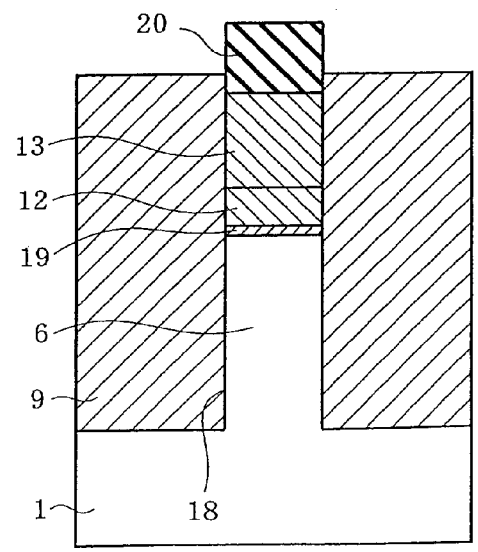
FIG. 10A    FIG. 10B

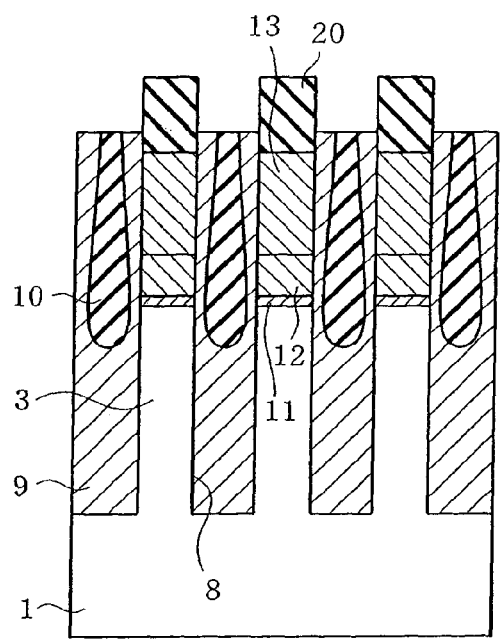
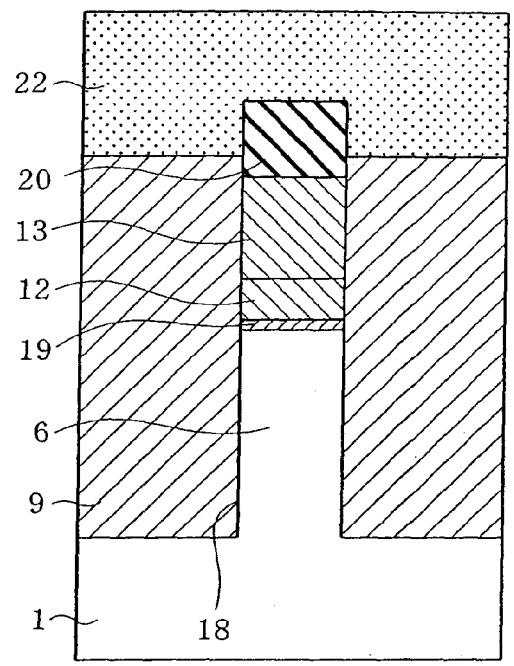
FIG.11A    FIG.11B
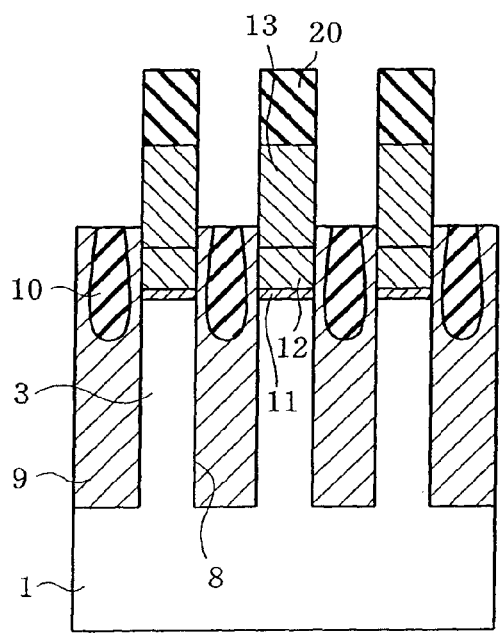
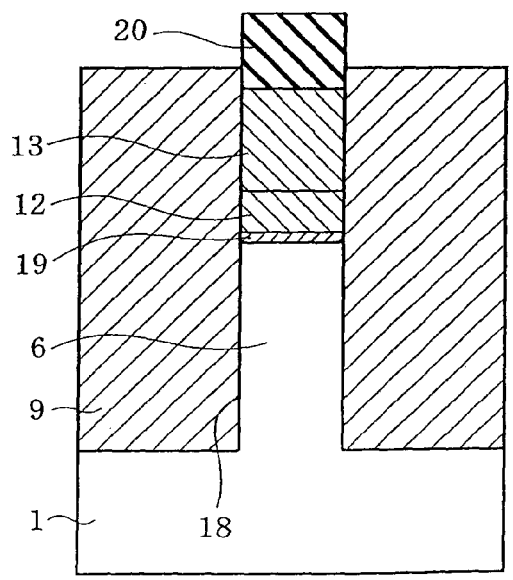
FIG.12A    FIG.12B

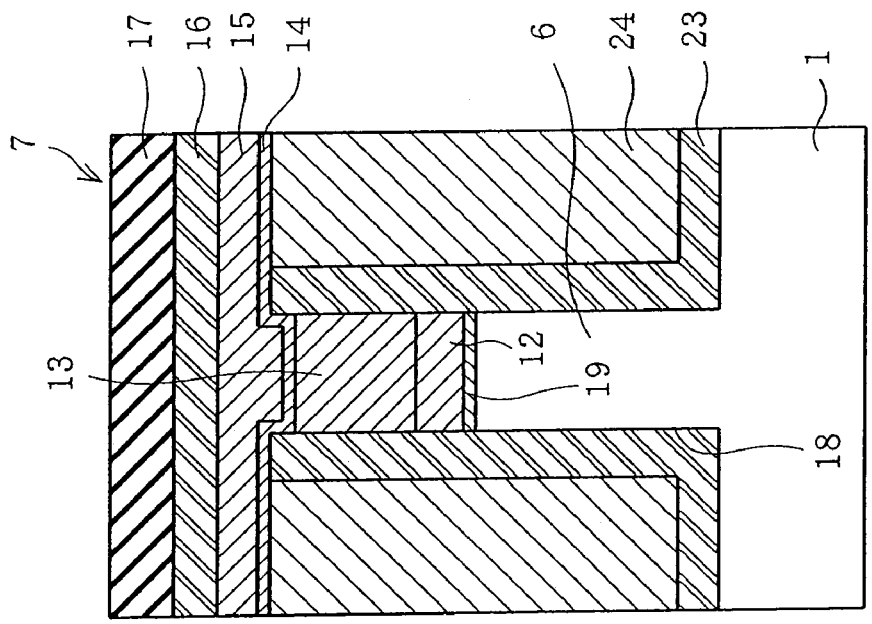
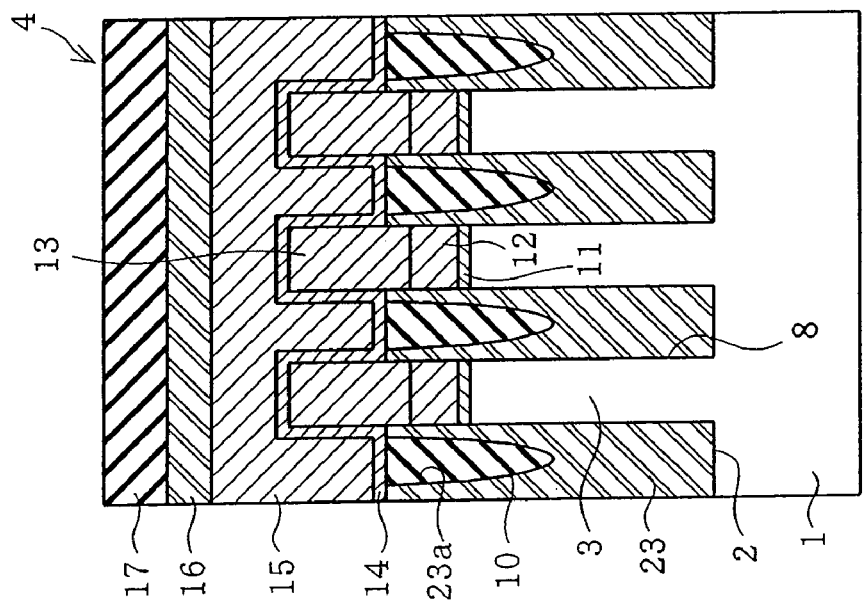
FIG. 14A
FIG. 14B

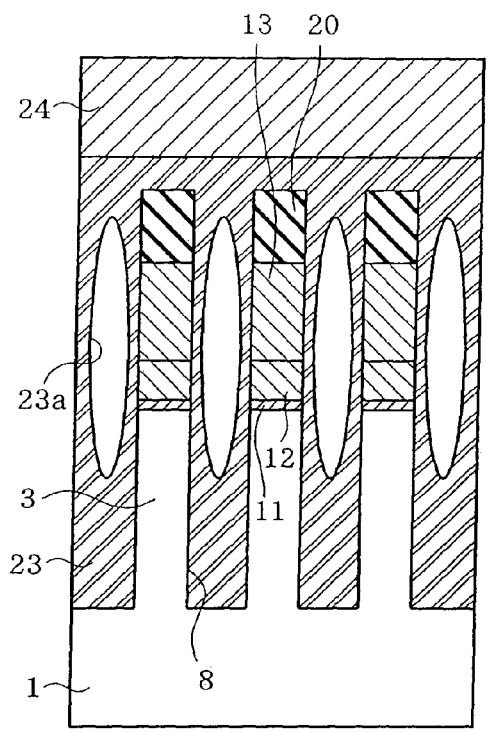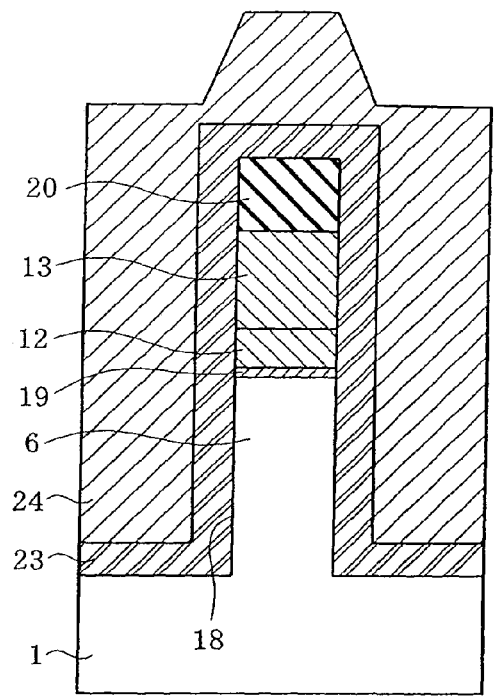
FIG.15A  FIG.15B
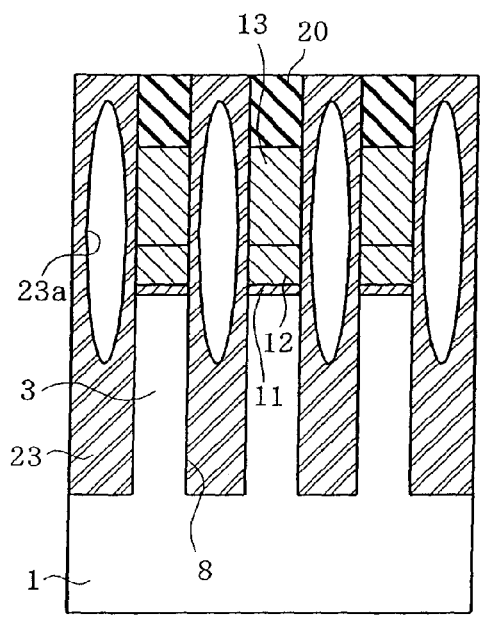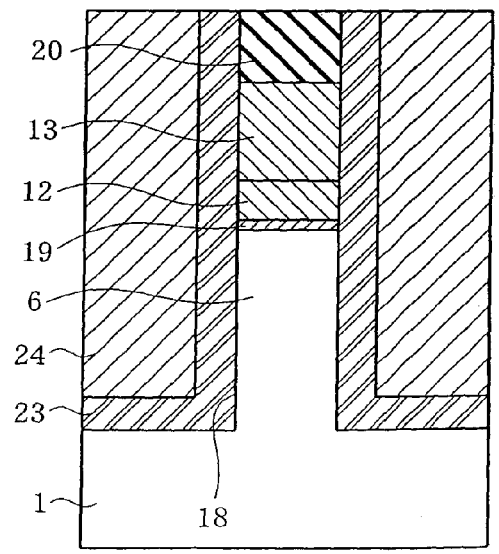
FIG.16A  FIG.16B

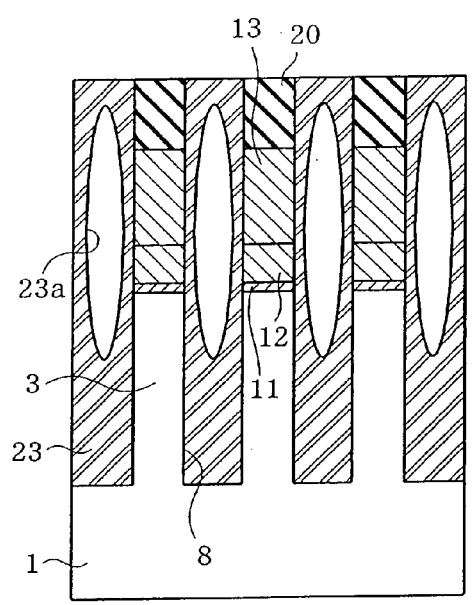
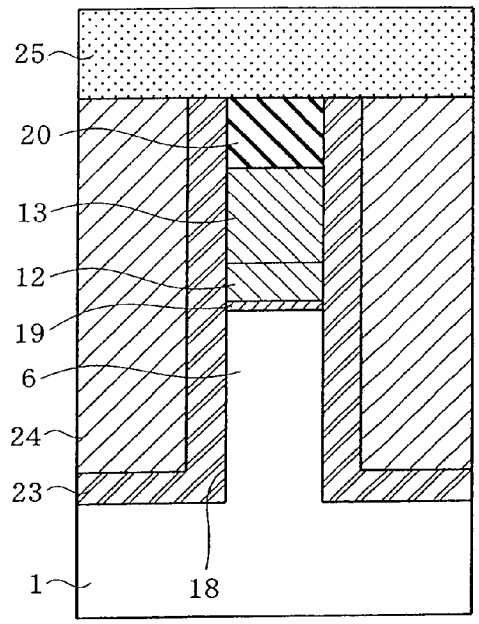
FIG.17A  FIG.17B
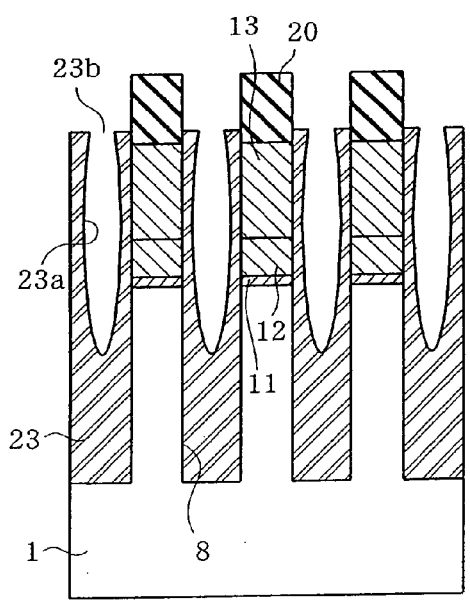
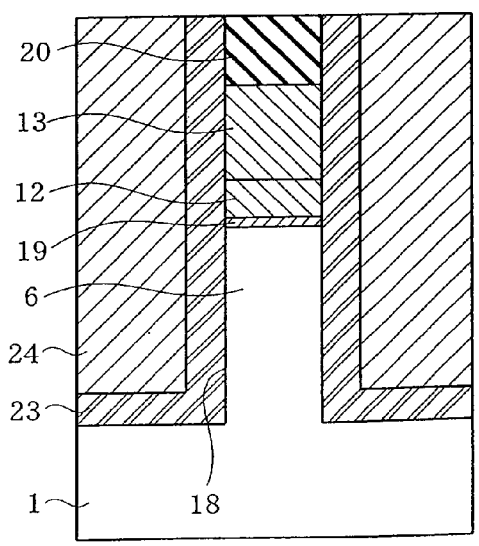
FIG.18A  FIG.18B

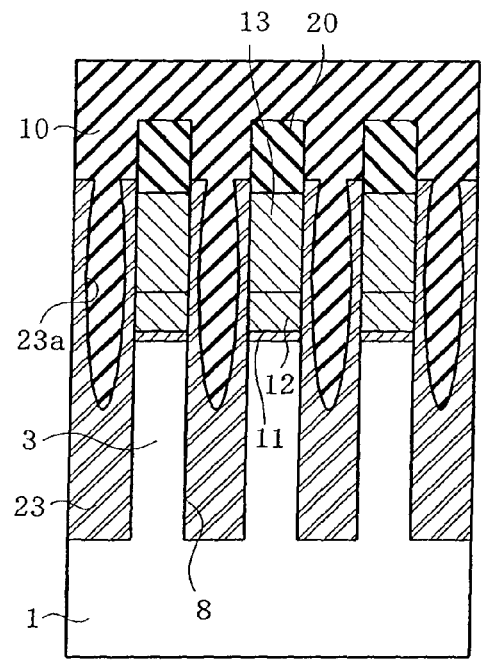
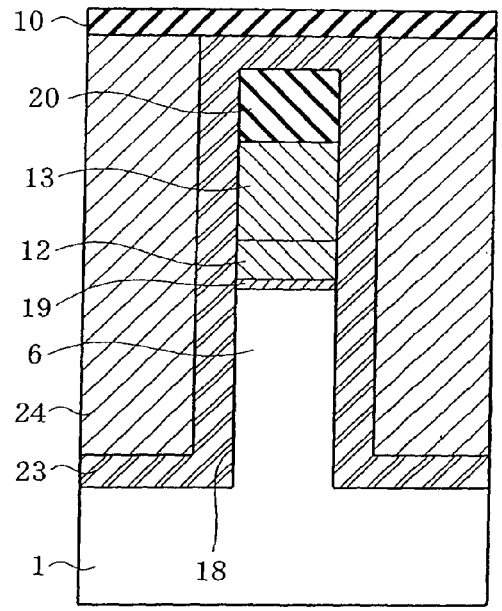
FIG.19A　　　　FIG.19B
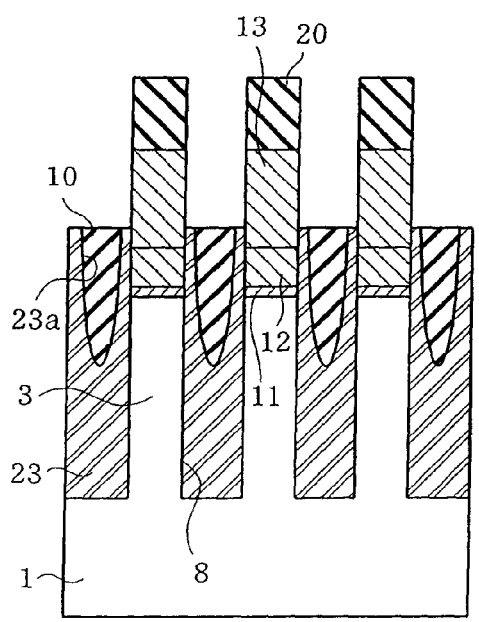
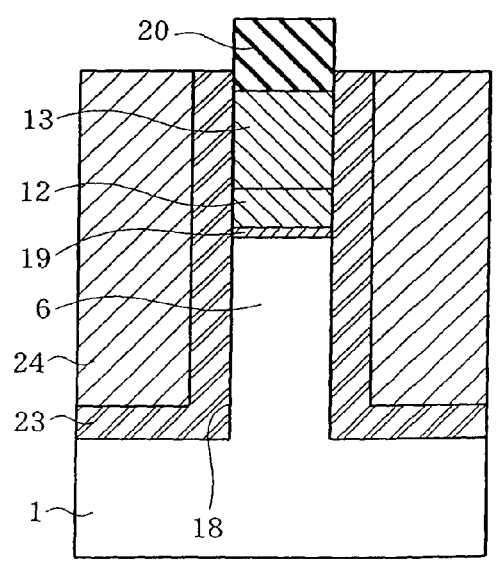
FIG.20A　　　　FIG.20B

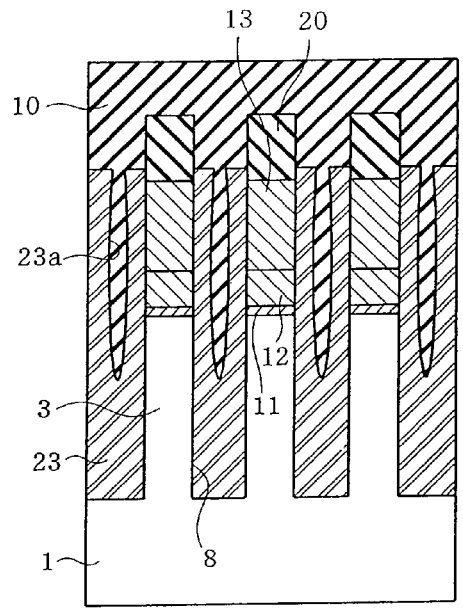
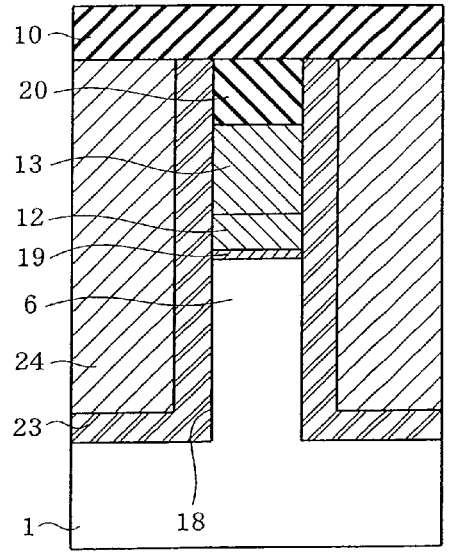
FIG.21A          FIG.21B
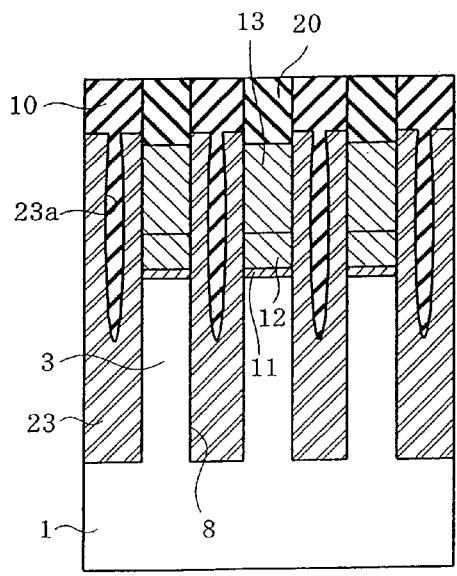
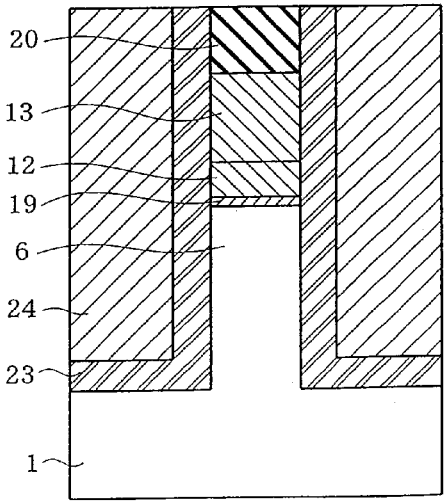
FIG.22A          FIG.22B

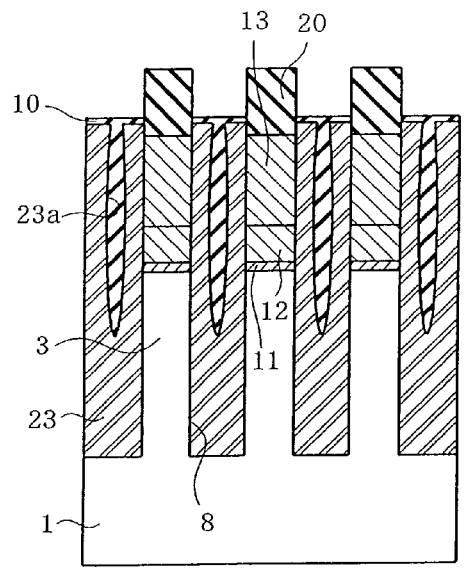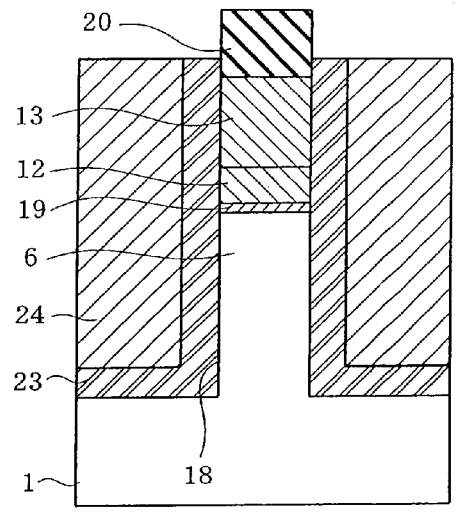
FIG.23A  FIG.23B
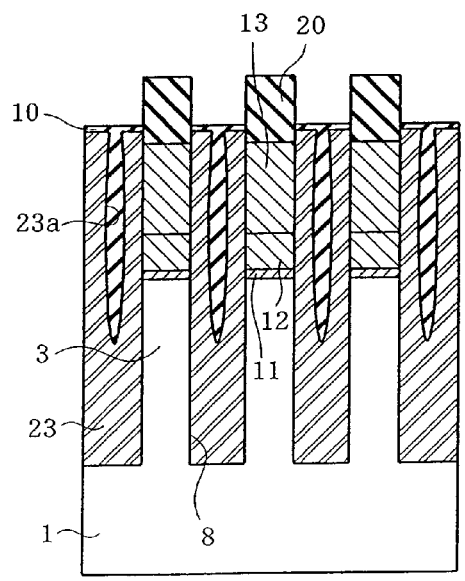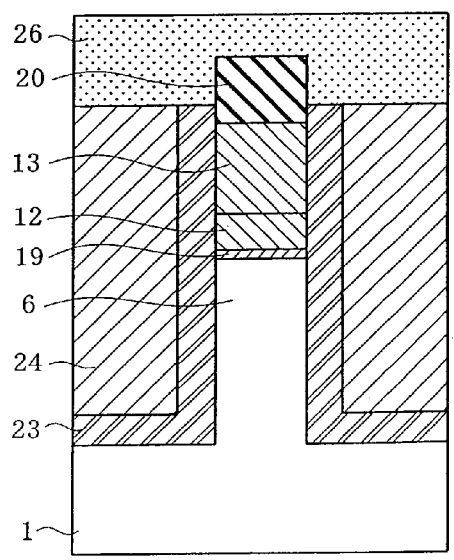
FIG.24A  FIG.24B

SEMICONDUCTOR DEVICE AND METHOD OF MANUFACTURING THE SAME

CROSS-REFERENCE TO RELATED APPLICATIONS

This application is a division of and claims the benefit of priority under 35 U.S.C. §120 from U.S. application Ser. No. 11/445,373, filed Jun. 2, 2006, and claims the benefit of priority under 35 U.S.C. §119 from Japanese patent Application No. 2005-162884, filed on Jun. 2, 2005. The entire contents of which are incorporated herein by reference.

BACKGROUND OF THE INVENTION

1. Field of the Invention

The present invention relates to a semiconductor device with a structure that insulating films are buried in element isolation trenches formed in a semiconductor substrate and having different opening widths and a method of manufacturing the same.

2. Description of the Related Art

In semiconductor devices constituting integrated circuits, refinement has progressed for the purpose of improving integration. The refinement includes reduction in an element isolation region as one of elements thereof. A shallow trench isolation (STI) technique has recently been introduced and realized element isolation by the employment of trenches with smaller widths. However, when an insulating film is insufficiently buried in a trench formed in a semiconductor substrate, insulation properties of the substrate would be adversely affected.

In view of the aforesaid problem, use of a coating type oxide film has conventionally been proposed. Japanese Patent No. 3178412 discloses one of the coating type oxide films. The coating type oxide film includes solutions such as a solution of silazane perhydride polymer (see Japanese Patent No. 3,178,412 and U.S. Pat. No. 6,191,002). The solution is spin-coated and heat-treated so as to be buried as an oxide film in a trench.

Element isolation regions are formed in both memory cell regions and peripheral circuit regions by an STI process in nonvolatile semiconductor devices respectively. In this case, after formation of the trench, a silicon oxide film is formed by a film forming method such as high density plasma (HDP) process so as to be buried in the trench. However, with progress of refinement of elements, void easily tends to occur in a narrow part of a region in which the silicon oxide film is buried.

The following countermeasure has been proposed to prevent occurrence of void. In burying the silicon oxide film in a trench, forming of the silicon oxide film is stopped before an upper opening of void occurring in a mid stage of the burying is closed by further execution of the burying. A polysilazane liquid is spin-coated so as to fill the void through the upper opening. A thermal treatment can be carried out after spin coating so that the polysilazane liquid is changed into a silicon oxide film.

It is desirable that the aforesaid thermal treatment should be carried out at a high temperature in an oxidizing atmosphere. However, a high-temperature treatment progresses oxidation in an edge of the silicon oxide film forming a gate insulating film, and a polycrystalline silicon film constituting the gate electrode is also oxidized. As a result, actually, a temperature for thermal treatment in the oxidizing atmosphere needs to be reduced for suppression of oxidation and thereafter, a high-temperature thermal treatment needs to be carried out in an inert atmosphere.

Then, the thermal treatment in the oxidizing atmosphere becomes insufficient such that impurities contained in the polysilazane liquid are diffused near to a silicon interface, whereupon a fixed charge results from the impurities. Consequently, an increased fixed charge adversely affects characteristics of the transistor in the peripheral circuit region where a larger amount of applying polysilazane liquid is deposited in the STI. For example, a Vg-Id characteristic of the peripheral transistor shows that the transistor is not reliably turned off even when a gate voltage drops to zero.

BRIEF SUMMARY OF THE INVENTION

Therefore, an object of the present invention is to provide a semiconductor device in which a coating type oxide film serving as the element isolation insulating films can reliably be buried in the element isolation trenches having different opening widths, whereupon defectives in the characteristic resulting from thermal treatment and fixed charge can be overcome, and a method of manufacturing the same.

In one aspect, the present invention provides a semiconductor device comprising a semiconductor substrate formed with a plurality of first element isolation trenches having respective first opening widths and a plurality of second element isolation trenches having larger opening widths than the first opening widths, element isolation insulating films buried in the first element isolation trenches so that upper parts of the trenches have partial openings, respectively and buried in the second element isolation trenches respectively, the coating-type oxide films not being buried in the second element isolation insulating trenches.

BRIEF DESCRIPTION OF THE DRAWINGS

Other objects, features and advantages of the present invention will become clear upon reviewing the following description of the embodiment with reference to the accompanying drawings, in which:

FIGS. 3A and 3B are views similar to FIGS. 1A and 1B, showing a first step of the manufacturing process, respectively;

FIGS. 4A and 4B are views similar to FIGS. 1A and 1B, showing a second step of the manufacturing process, respectively;

FIGS. 5A and 5B are views similar to FIGS. 1A and 1B, showing a third step of the manufacturing process, respectively;

FIGS. 6A and 6B are views similar to FIGS. 1A and 1B, showing a fourth step of the manufacturing process, respectively;

FIGS. 7A and 7B are views similar to FIGS. 1A and 1B, showing a fifth step of the manufacturing process, respectively;

FIGS. 8A and 8B are views similar to FIGS. 1A and 1B, showing a sixth step of the manufacturing process, respectively;

FIGS. 9A and 9B are views similar to FIGS. 1A and 1B, showing a seventh step of the manufacturing process, respectively;

FIGS. 10A and 10B are views similar to FIGS. 1A and 1B, showing an eighth step of the manufacturing process, respectively;

FIGS. 11A and 11B are views similar to FIGS. 1A and 1B, showing a ninth step of the manufacturing process, respectively;

FIGS. 12A and 12B are views similar to FIGS. 1A and 1B, showing a tenth step of the manufacturing process, respectively;

FIGS. 14A and 14B are views similar to FIGS. 1A and 1B, showing a second embodiment of the invention, respectively;

FIGS. 15A and 15B are views similar to FIGS. 14A and 14B, showing a first step of the manufacturing process, respectively;

FIGS. 16A and 16B are views similar to FIGS. 14A and 14B, showing a second step of the manufacturing process, respectively;

FIGS. 17A and 17B are views similar to FIGS. 14A and 14B, showing a third step of the manufacturing process, respectively;

FIGS. 18A and 18B are views similar to FIGS. 14A and 14B, showing a fourth step of the manufacturing process, respectively;

FIGS. 19A and 19B are views similar to FIGS. 14A and 14B, showing a fifth step of the manufacturing process, respectively;

FIGS. 20A and 20B are views similar to FIGS. 14A and 14B, showing a sixth step of the manufacturing process, respectively;

FIGS. 21A and 21B illustrate a third embodiment of the invention, showing a first step of the manufacturing process;

FIGS. 22A and 22B are views similar to FIGS. 21A and 21B, showing a second step of the manufacturing process, respectively;

FIGS. 23A and 23B are views similar to FIGS. 21A and 21B, showing a third step of the manufacturing process, respectively;

FIGS. 24A and 24B are views similar to FIGS. 21A and 21B, showing a fourth step of the manufacturing process, respectively;

DETAILED DESCRIPTION OF THE INVENTION

A first embodiment of the present invention will be described with reference to FIGS. 1A to 13. In the embodiment, the invention is applied to a NAND flash memory which is a nonvolatile memory device.

Figure 1A:
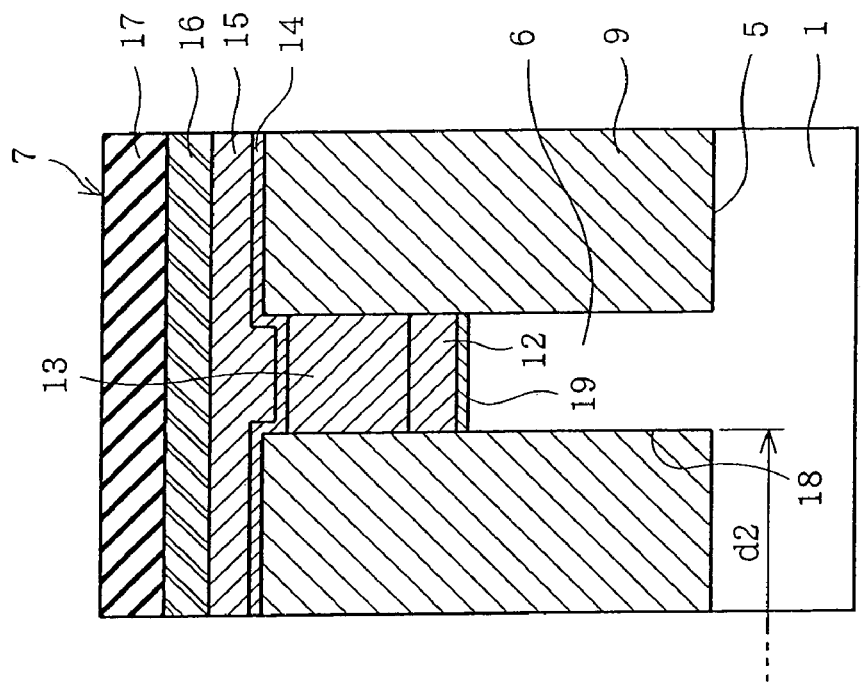
FIGS. 1A and 1B are schematic longitudinal sections of a semiconductor device in accordance with a first embodiment of the present invention.
Figure 1B:
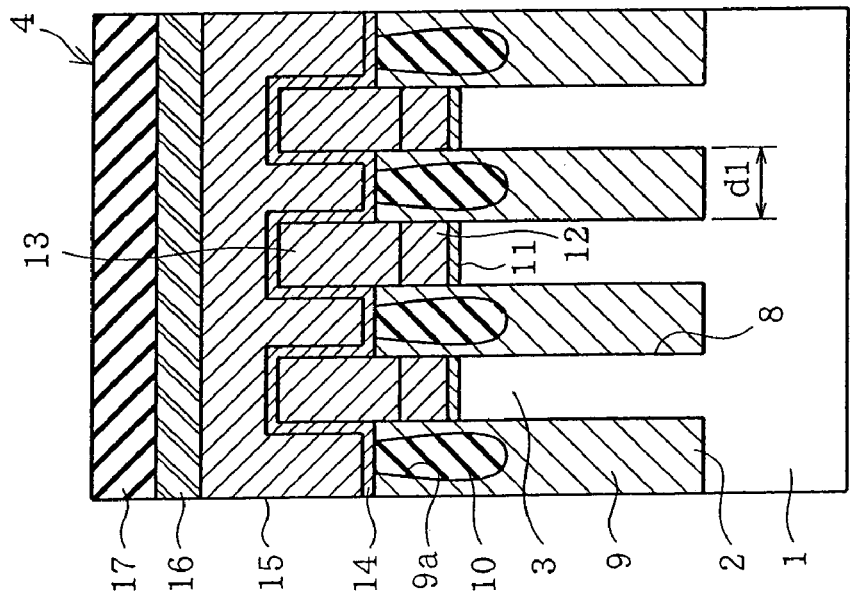
Figures 2A, 2B:
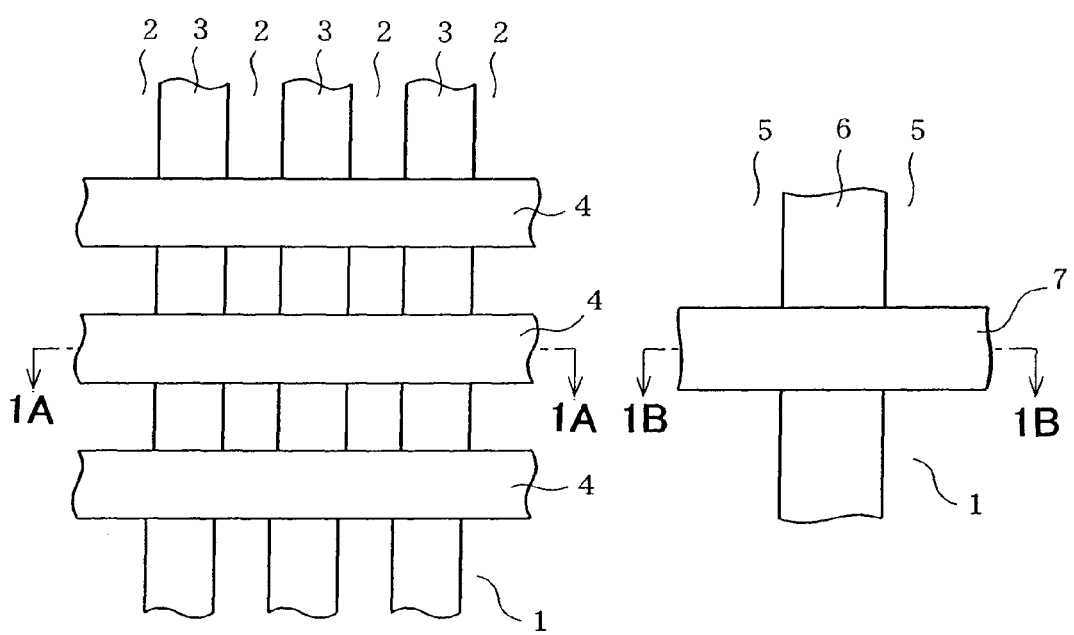
FIGS. 2A and 2B are plan views of the semiconductor device, corresponding to FIGS. 1A and 1B respectively.

FIGS. 1A and 1B and 2A and 2B are schematic sectional views and plan views of transistors formed in a memory cell region and a peripheral circuit region of the NAND flash memory respectively. Referring first to FIG. 2A showing the memory cell region, a silicon substrate 1 serving as a semiconductor substrate includes an element isolation region 2 formed therein by a shallow trench isolation (STI) process. The element isolation region will hereinafter be referred to as "STI 2," whereby an active region 3 is separately formed as an element forming region.

The STI 2 is formed by burying an insulating film in a first element isolation trench having a narrow or small (first) opening width. A number of gate electrodes 4 are formed at predetermined intervals so as to extend in a direction perpendicular to the active region 3. Memory cell transistors are formed at intersections of the active regions 3 and the gate electrodes 4 respectively. Each memory cell transistor is formed with a floating gate on which a gate electrode 4 is formed with an insulating film being interposed therebetween.

Referring now to FIG. 2B showing the peripheral circuit region, an STI 5 serving as an element isolation region is formed in the silicon substrate 1 in the same manner as described above, whereby an active region 6 is separately formed as an element forming region. A gate electrode 7 is formed so as to extend in the direction perpendicular to the active region 6. The STI 5 is formed by burying an insulating film in a second element isolation trench having a larger (second) opening width than the STI 2. A peripheral circuit transistor is formed at an intersection of the active region 6 and the gate electrode 7. Transistors are also formed in the other part of the peripheral circuit region. These transistors include those with high or low breakdown voltage and drive the memory cell transistors.

The sectional structure will be described with reference to FIGS. 1A and 1B. FIG. 1A is a section taken along line 1A-1A in FIG. 2A whereas FIG. 1B is a section taken along line 1B-1B in FIG. 2B. Referring first to FIG. 1A, the STI's 12 are formed on the silicon substrate 1 at predetermined intervals. Each STI 12 is formed by burying a high density process (HDP) film and a polysilazane film 10 in the first element isolation trenches 8 having the smaller (first) opening width (width d1 in the drawings). In this case, the HDP film 9 has an opening or void 9a produced in an upper part thereof. The polysilazane film 10 is formed so as to be buried in the void 9a.

The silicon substrate 1 includes a part constituting each active region 3 isolated by the STI 2. The part of the silicon substrate 1 has an upper surface located lower than an upper surface of the STI 2. A silicon oxide film 11 is formed on the upper surface of the part of the silicon substrate 1. The silicon oxide film 11 serves as a gate insulating film and has a film thickness of about 10 nm. First and second polycrystalline silicon films 12 and 13 are deposited on an upper side of the silicon oxide film 11 in turn. The first polycrystalline silicon film 12 constitutes a floating gate electrode. In this case, the first polycrystalline silicon film 12 has a film thickness of about 40 nm whereas the second polycrystalline silicon film 13 is doped with phosphorus (P) and has a film thickness of about 100 nm.

Each of the first and second polycrystalline silicon films 12 and 13 has the same width as the active region 3. The second polycrystalline silicon film 13 has an upper surface located higher than the upper surface of the STI 2. An oxide-nitride-oxide (ONO) film 14 serving as an insulating film is formed on upper surfaces of the STI 2 and the second polycrystalline silicon film 13 so as to be located between an intergate insulating film or the floating gate electrode and a control gate electrode. The ONO film 14 has a film thickness of about 20 nm. On an upper side of the ONO film 14 are deposited a third polycrystalline silicon film 15, a tungsten silicide (WSi) film 16 and a silicon oxide film 17 sequentially. The third polycrystalline silicon film 15 and the WSi film 16 constitute the control gate electrode. The third polycrystalline silicon film 15 is planarized so as to eliminate irregularities of the lower ONO film 14.

Referring next to FIG. 1B showing the transistor of the peripheral circuit region, STI's 5 are formed on the silicon substrate 1 at predetermined intervals. Each STI 5 is formed by burying the HDP film 9 in the second element isolation trench 18 having a larger second opening width (designated by d2 in FIG. 1B). Differing from the HDP film 9 buried in the first trench 8, the HDP film 9 buried in the second trench 18 has no void since the second trench has a larger opening width.

The silicon substrate 1 includes a part constituting each active region 6 isolated by the STI 5. The part of the silicon substrate 1 has an upper surface located lower than an upper surface of the STI 5. A silicon oxide film 19 is formed on the upper surface of the part of the silicon substrate 1 and has a film thickness of about 40 nm. On the upper surface of the silicon oxide film 19 are deposited the first and second polycrystalline silicon films 12 and 13, the ONO film 14, the third polycrystalline silicon film 15, the WSi film 16, the silicon oxide film 17 sequentially, in the same manner as in the memory cell transistor. The first polycrystalline silicon film 12 constitutes a gate electrode.

Figure 13:
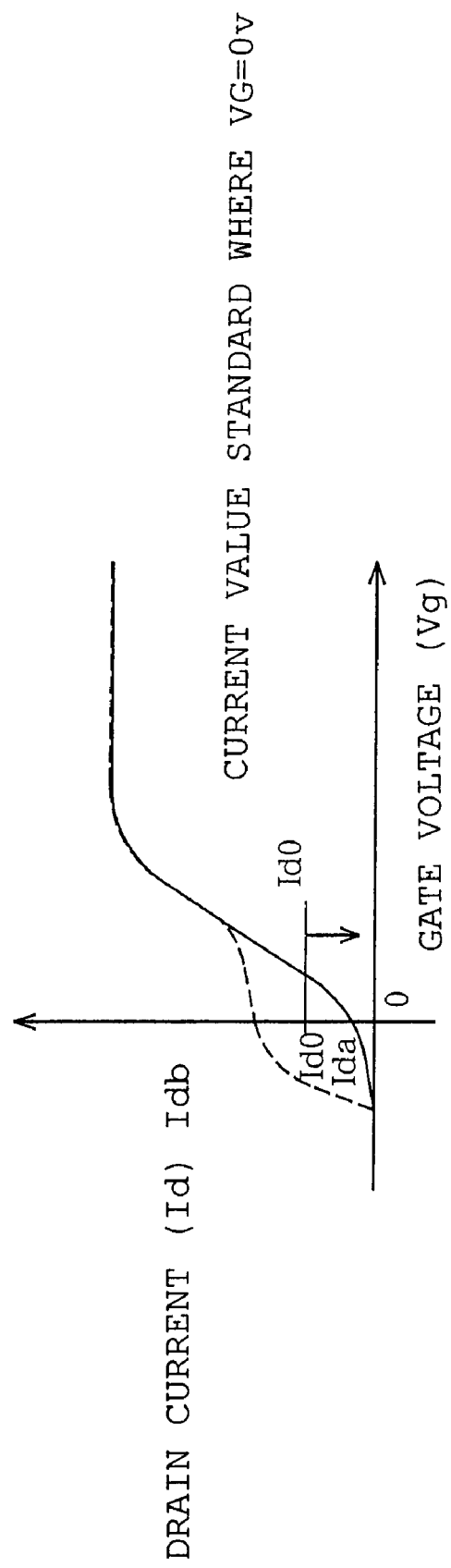
FIG. 13 is a graph showing the on-off characteristic of a memory cell transistor.

The STI 5 is formed under the condition that the HDP film 9 is buried in the element isolation trench 18 with the larger opening width. In this case, only the void 9a produced in the step of burying the HDP film 9 in the first trench 8 is filled with the polysilazane film 10 for formation of the STI 2. Consequently, an amount of polysilazane film 10 used can be rendered minimum. Furthermore, since no polysilazane film 10 is used for the STI 5 in the transistors of the peripheral circuit region, occurrence of fixed charge due to carbon etc. contained as the result of thermal treatment or the like can be prevented. This can be understood from the relationship between gate voltage Vg and the drain current Id in a transistor as shown in FIG. 13. An axis of abscissas designates gate voltage Vg and an axis of ordinates designates drain current Id in FIG. 13.

More specifically, the embodiment has a normal on-off characteristic as shown by solid line in FIG. 13. However, in the case of a conventional device, fixed charge occurs and accordingly, the drain current Id flows in excess of a predetermined level Id0 even when the gate voltage Vg is set to zero, resulting in poor electric characteristic. More specifically, a partial channel not depending on the gate voltage Vg is formed when fixed charge remains in a part brought into contact with the STI 5 in a portion where a channel of the active region 6 is formed. As a result, the device is not completely turned off.

The manufacturing process for the above-described configuration will now be described with reference to FIGS. 3A to 12B. FIGS. 3A to 12B correspond to FIGS. 1A and 1B respectively. Firstly, a silicon oxide film 11 with a film thickness of about 10 nm is formed on the silicon substrate 1 by a thermal oxidation technique as shown in FIGS. 3A and 3B. The silicon oxide film 11 serves as a gate insulating film of the memory cell transistor. Furthermore, a silicon oxide film 19 is formed at a part where a transistor with high breakdown voltage of the peripheral circuit region is to be formed although a step of forming the silicon oxide film is not shown. The silicon oxide film 19 has a film thickness of about 40 nm.

Subsequently, the polycrystalline silicon film 12 having a film thickness of 40 nm is deposited on the silicon oxide film 11 by a low-pressure chemical vapor deposition (LPCVD) process and thereafter, another polycrystalline silicon film 13 is deposited on the film 12 by the LPCVD process, whereby a floating gate electrode is formed. The polycrystalline silicon film 13 has a film thickness of 100 nm and is doped with phosphorus. A silicon nitride film 20 having a film thickness of 70 nm is deposited on the polycrystalline silicon film 13 by the LPCVD process.

Successively, a photoresist 21 is patterned into a predetermined configuration corresponding to the element isolation trench by a photolithography technique as shown in FIGS. 4A and 4B. Next, a reactive ion etching (RIE) process is carried out with the photoresist 21 serving as a mask to etch the silicon nitride film 20, second polycrystalline silicon film 13, first polycrystalline silicon film 12, silicon oxide films 11 and 19 and silicon substrate 1. As a result, the first element isolation trench 8 having the smaller first opening width d1 is formed in the memory cell region. The second element isolation trench 18 having the larger second opening width d2 is formed in the peripheral circuit region. The photoresist 21 is then removed by an ashing technique.

The HDP film 9 is deposited in the memory cell region and peripheral circuit region by the HDP process so as to have a film thickness of about 500 nm as shown in FIGS. 6A and 6B. The film thickness of the HDP film 9 is set so that the second element isolation trench 18 of the peripheral circuit region is sufficiently filled with the HDP film. When the HDP film 9 is formed so as to have the film thickness, the void 9a occurs in the memory cell region since an aspect ratio is high at the first element isolation trench 8 side so that the trench cannot be buried.

Subsequently, the HDP film 9 is polished by chemical mechanical polishing (CMP) process to be planarized until the silicon nitride film 20 serving as a stopper film is exposed. In this case, the void 9a is exposed on the surface of the HDP film 9 in the memory cell region, whereupon the interior of the void 9a is exposed through the opening 9b.

A polysilazane film 10 which is one type of coating type oxide films is deposited by 300 nm as shown in FIGS. 8A and 8B. The coating type oxide film is also called as "spin on glass" (SOG). Silanol dissolved in alcohol is recently used as SOG. In forming the polysilazane film 10, the void 9 can be filled through the opening 9b with the polysilazane film 10 by means of application. The polysilazane film 10 is thermally treated in an oxidizing atmosphere ranging from 400° C. to 500° C. after application thereby to be turned to a silicon oxide film. Thereafter, the silicon oxide film is thermally treated in an inert atmosphere ranging from about 800° C. to 900° C.

The polysilazane film 10 is polished by the CMP process with the silicon nitride film 20 serving as the stopper thereby to be planarized, as shown in FIGS. 9A and 9B. In this state, as shown, the polysilazane film 10 is buried only in the void 9a in the memory cell region, whereas the entire polysilazane film 10 in the peripheral circuit region is removed. Successively, the HDP film 9 and the polysilazane film 10 are etched 50 nm by the RIE process as shown in FIGS. 10A and 10B. The photoresist 22 is then formed by the photolithography technique into a pattern masking a part other than the memory cell region or the peripheral circuit region in the embodiment, as shown in FIGS. 11A and 11B. Thereafter, the HDP film 9 and the polysilazane film 10 in the memory cell region are etched about 100 nm with the photoresist 22 serving as the mask. Thereafter, the photoresist 22 is removed by the ashing technique.

Subsequently, the silicon nitride film 20 is removed and thereafter, the third polycrystalline silicon film 15, WSi film 16 and silicon oxide film 17 constituting the ONO film 14 and control gate electrode are deposited, whereby the structure as shown in FIGS. 1A and 1B is obtained. Although not shown in FIG. 1, the mask material is deposited and an etching process is carried out by the photolithography technique, RIE technique or the like. A pattern structure of gate electrodes 4 and 7 as shown in FIGS. 2A and 2B is obtained.

In a case where the above-described manufacturing process is adopted, the void 9a is caused to occur when the HDP film 9 is buried in the first element isolation trench 8. In a subsequent step, the CMP process is carried out so that the void 9a is exposed as the opening 9b, whereby the polysilazane film 19 can be buried in the opening 9b. As a result, the HDP film 9 can reliably be buried at the second element isolation trench 18 side. Accordingly, although the element isolation trenches 8 and 18 with different opening widths are formed, the polysilazane film 10 is effectively buried only in the element isolation trench 8, whereupon the STI's 2 and 5 can be formed. In this case, since the polysilazane film 10 is not buried in the second element isolation trench 18, the characteristics of the element isolation trench 18 can be prevented from deterioration.

FIGS. 14A through 20B illustrate a second embodiment of the invention. Only the difference of the second embodiment from the first embodiment will be described in the following. FIGS. 14A and 14B correspond to FIGS. 1A and 1B respectively. A TEOS film 23 serving as the first element isolation insulating film is buried in the first element isolation trench 8 having the smaller (first) opening width. The polysilazane film 10 serving as the coating type oxide film is buried in the void 23a produced in the upper part of the TEOS film 23. Furthermore, the TEOS film 23 serving as the first element isolation insulating film is formed on sidewalls and a bottom of the second element isolation trench 18 having the larger (second) opening width. The TEOS film 23 has a predetermined film thickness. The HDP film 24 is buried in the trench 18 so as to fill the interior of the trench.

The TEOS film 23 serving as the first element isolation insulating film is formed by the LPCVD process. Since the TEOS film 23 has a good step coverage, the TEOS film 23 can sufficiently reach the bottom of the first element isolation trench 8. Since the aspect ratio is high at the upper opening of the first element isolation trench 8, the void 23a is produced. The polysilazane film 10 is buried in the void 23a by a step which will be described later, whereupon the second embodiment can achieve the same effect as the first embodiment.

The manufacturing process of the upper structure will be described with reference to FIGS. 15A to 20B. The silicon oxide films 11 and 19 are formed on the silicon substrate 1 in the same manner as the first embodiment. Furthermore, the polycrystalline silicon films 12 and 13 and silicon nitride film 20 are formed (see FIGS. 3A and 3B). Successively, the first and second element isolation trenches 8 and 18 are formed (see FIGS. 4A to 5B). Next, the TEOS film 23 is deposited by 50 nm by the LPCVD and successively, the HDP film 24 is deposited by 500 nm by the HDP process. The TEOS film 23 has such a film thickness as to fill the first element isolation trench 8. In the memory cell region, the void 23a is produced in the TEOS film 23 buried in the first element isolation trench 8 as shown in FIG. 15A. Furthermore, as shown in FIG. 15B, the TEOS film 23 and HDP film 24 are deposited in the second element isolation trench 18 in the peripheral circuit region in turn.

Subsequently, the HDP film 24 and TEOS film 23 are shaved and planarized until the silicon nitride film 20 is exposed as shown in FIGS. 16A and 16B. Since the void 23a produced in the TEOS film 23 in the first element isolation trench 8 is not exposed, the polysilazane silicon film 10 cannot be buried.

Subsequently, the photoresist 25 is patterned by the photolithography technique so as to cover the region other than the memory cell region (the peripheral circuit region in the embodiment). The TEOS film 23 in the memory cell region is etched 50 nm by the RIE process with the photoresist 25 serving as a mask as shown in FIGS. 18A and 18B. As a result, the void 23a of the TEOS film 23 in the first element isolation trench 8 is exposed such that the opening 23b is formed. Thereafter, the photoresist 25 is removed by the ashing technique.

Subsequently, the polysilazane film 10 serving as the coating oxide film is deposited thinly as shown in FIGS. 19A and 19B. The film thickness of the polysilazane film 10 is about 100 nm, for example. Thereafter, the polysilazane film 10 is thermally treated in an oxidizing atmosphere at the temperature ranging from about 400° C. to about 500° C. thereby to be changed into a silicon oxide film. Thereafter, the silicon oxide film is thermally treated in an inert atmosphere at the temperature ranging from about 800° C. to about 900° C.

Subsequently, the polysilazane film 10, TEOS film 23 and HDP film 20 are etched 200 nm by the RIE process as shown in FIGS. 20A and 20B. Thereafter, the silicon nitride film 20 is removed and subsequently, the ONO film 14, third polycrystalline silicon film 15 constituting the control gate electrode, WSi film 16 and silicon oxide film 17 are deposited sequentially in the same manner as in the first embodiment, whereupon the configuration as shown in FIGS. 14A and 14B is obtained.

In a case where the above-described manufacturing process is adopted, the void 23a is caused to occur when the TEOS film 23 is buried in the first element isolation trench 8. After the HDP film 24 has been buried, the CMP process and the etchback process are carried out so that the void 23a is exposed as the opening 23b, whereupon the void 23a can be filled with the polysilazane film 10. Consequently, the TEOS film 23 and the HDP film 24 can reliably be buried at the second element isolation trench 18 side. Thus, the second embodiment can achieve the same effect as the first embodiment.

FIGS. 21A to 25B illustrate a third embodiment of the invention. Only the difference of the third embodiment from the second embodiment will be described in the following. The TEOS film 23 and the HDP film 24 are also used as the first and second element isolation insulating films in the third embodiment in the same manner as in the second embodiment, respectively. Although a first half of the manufacturing process in the third embodiment is identical with that in the second embodiment, the third embodiment slightly differs from the second embodiment in the thicknesses of the films to be formed.

FIGS. 21A and 21B correspond to FIGS. 19A and 19B in the second embodiment respectively. A part of the manufacturing process to obtain the states of the device as shown in FIGS. 21A and 21B is similar to that in the second embodiment. Processing conditions will be described in brief. The TEOS film 23 serving as the first element isolation insulating film is formed by the LPCVD process so as to have a film thickness of 40 nm. The HDP film 24 serving as the second element isolation insulating film is formed so as to have a film thickness of 50 nm (corresponding to the states of FIGS. 15A and 15B). The TEOS film 23 and the HDP film 24 are etched by the RIE process by 60 nm (corresponding to the states of FIGS. 18A and 18B).

Figure 25A:
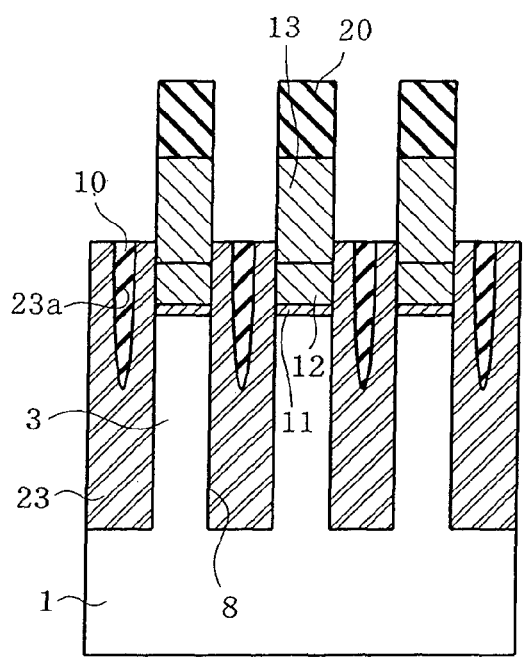
FIGS. 25A and 25B are views similar to FIGS. 21A and 21B, showing a fifth step of the manufacturing process, respectively.
Figure 25B:
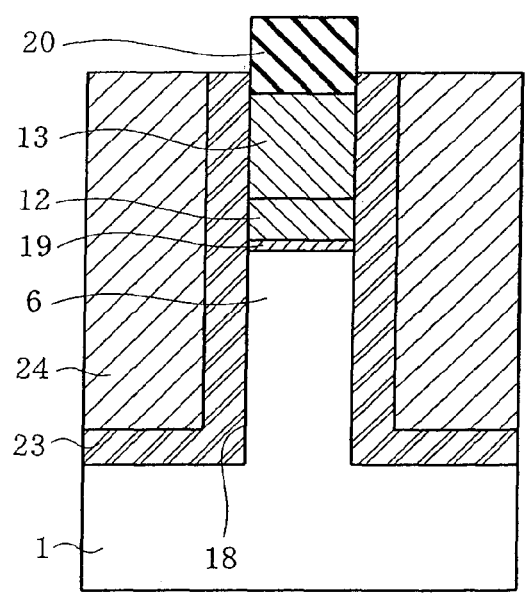

FIGS. 21A and 21B illustrate the above-described device which is further formed with the polysilazane film 10 serving as the coating type oxide film. The polysilazane film 10 has a film thickness of 300 nm. Successively, the CMP process is carried out for the polysilazane film 10 until the silicon nitride film 20 is exposed, whereby the surface of the polysilazane film is planarized. Subsequently, the RIE process is carried out so that the TEOS, HDP and polysilazane films 23, 24 and 10 are etched 50 nm as shown in FIGS. 23A and 23B. Successively, the photoresist 26 is processed by the photolithography technique so as to mask the region other than the memory cell region as shown in FIGS. 24A and 24B. The HDP film 24 in the memory cell region and the polysilazane film 10 are etched 100 nm by the RIE process with the photoresist 26 serving as a mask as shown in FIGS. 25A and 25B and thereafter, the photoresist 26 is removed by the ashing technique and wet processing technique.

The states similar to those as shown in FIGS. 20A and 20B in the second embodiment can be obtained in the manner as described above. Thus, the third embodiment can achieve the same effect as the second embodiment.

FIGS. 26A to 27B illustrate a fourth embodiment of the invention. Only the difference of the fourth embodiment from the first embodiment will be described in the following.

Figure 26A:
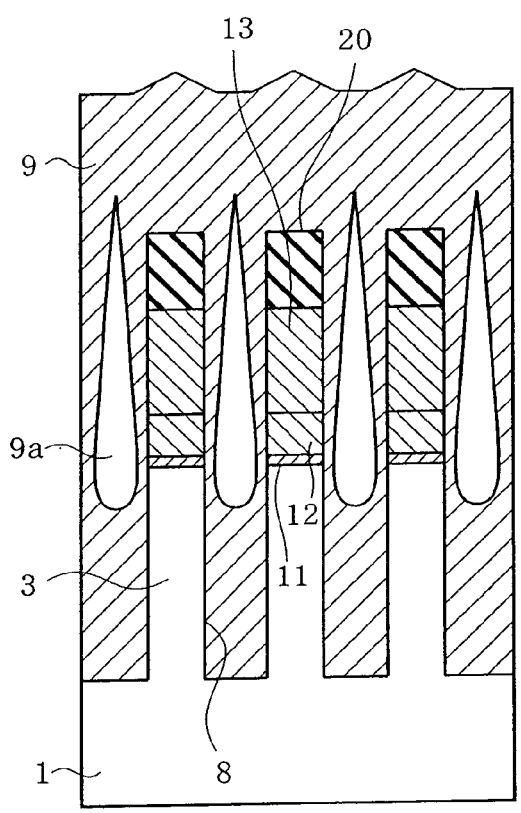
FIGS. 26A and 26B illustrate a fourth embodiment of the invention, showing a step of the manufacturing process.
Figure 26B:
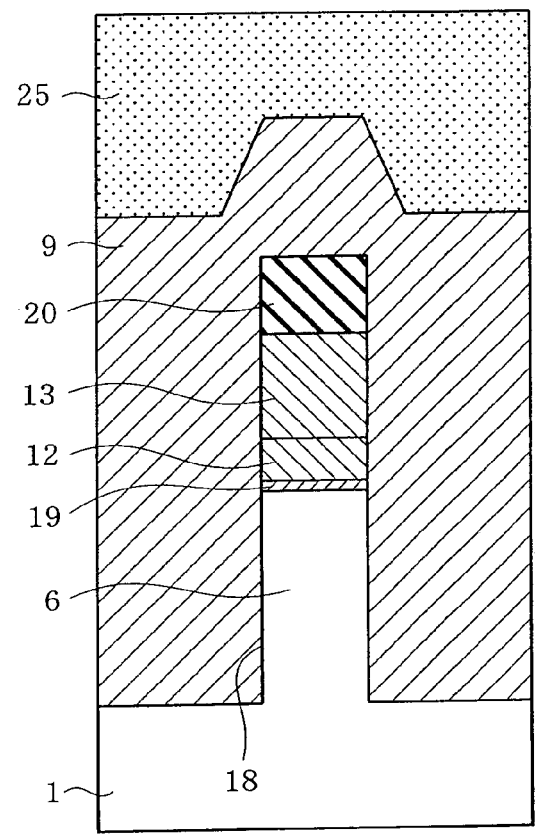
Figure 27A:
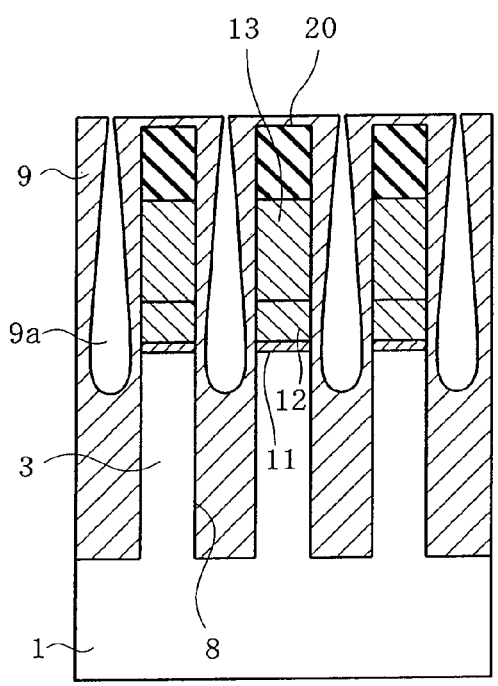
FIGS. 27A and 27B are views similar to FIGS. 26A and 26B, showing another step of the manufacturing process, respectively.
Figure 27B:
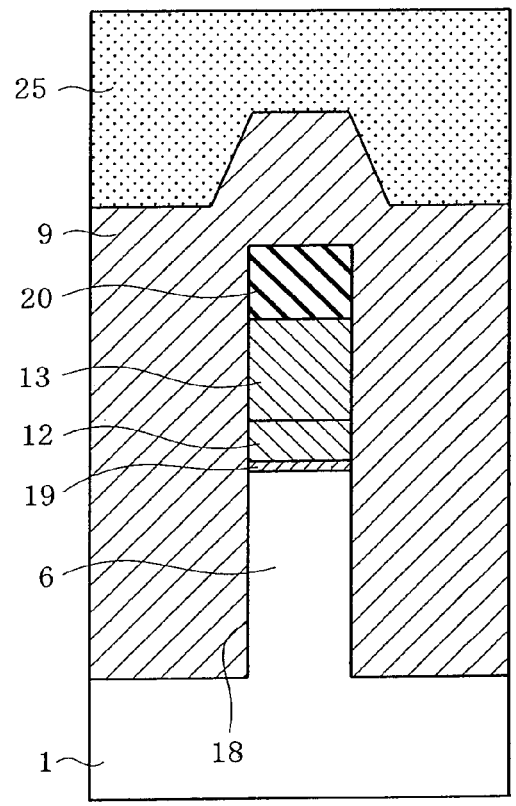

In the first embodiment, the HDP film 9 is deposited in FIG. 6 and thereafter, the HDP film 9 is polished by the CMP process so that the void 9a is exposed. However, the HDP film 9 of the memory cell region can be etched by the RIE process so that the void 9a is exposed. More specifically, in the states as shown in FIGS. 6A and 6B, the photoresist 25 is patterned by the photolithography technique so as to cover the region other than the memory cell region (the peripheral circuit region in the fourth embodiment), as shown in FIGS. 26A and 26B. Subsequently, the TEOS film 23 is etched 50 nm by the RIE process with the photoresist 25 serving as a mask, so that the void 9a in the HDP film 9 buried in the first insulating film 8 is exposed. Successively, the void 9a is filled with the polysilazane film 10, whereby the structure as shown in FIGS. 1A and 1B is obtained.

The invention should not be limited to the above embodiments but the embodiments may be modified or expanded as follows. In each of the above-described embodiments, the polysilazane film of the SOG films is used as the coating type oxide film. However, any SOG film that achieves the same characteristics can be used.

Various types of insulating films may be used as the element isolation insulating films, instead of the HDP film and the TEOS film. Additionally, the film thicknesses and processing conditions of various types of films may be changed.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended claims.

What is claimed is:

1. A semiconductor device comprising:
a semiconductor substrate formed with a plurality of first element isolation trenches having respective first opening widths and a plurality of second element isolation trenches having larger opening widths than the first opening widths;
element isolation insulating films buried in the first element isolation trenches so that upper parts of the trenches have partial openings, respectively and buried in the second element isolation trenches respectively; and
coating type oxide films formed so as to fill the openings of the first element isolation trenches, respectively, the coating-type oxide films not filling the second element isolation insulating trenches.

2. A semiconductor device comprising:
a semiconductor substrate formed with a plurality of first element isolation trenches having respective first opening widths and a plurality of second element isolation trenches having larger opening widths than the first opening widths, each second element isolation trench having a bottom and sidewalls;
first element isolation insulating films buried in the first element isolation trenches so that upper parts of the trenches have partial openings, respectively and formed so as to cover the bottoms and the sidewalls of the second element isolation trenches respectively;
coating type oxide films formed so as to fill the openings of the first element isolation insulating films of the first element isolation trenches, respectively; and
second element isolation insulating films differing from the coating-type oxide films and formed on the first element isolation insulating films so as to be buried in the second element isolation trenches respectively.

3. The semiconductor device according to claim 2, wherein each first element isolation insulating film is a tetra-ethoxy-silane (TEOS), and each second element isolation insulating film is a high density plasma (HDP) film.

4. A semiconductor device including a memory region having a memory cell transistor and a peripheral region having a peripheral circuit transistor driving the memory cell transistor, comprising:
a semiconductor substrate including a first trench having a first opening width in the memory region and a second trench having a second opening width which is larger than the first opening width in the peripheral region;
a first element isolation insulating film buried in the first trench, including a deposition-type silicon oxide film having a recess at an upper end portion thereof and a coating-type silicon oxide film formed in the recess;
a first gate insulating film formed on the semiconductor substrate in the memory region;
a first gate electrode of the memory cell transistor formed on the first gate insulating film;
a second element isolation insulating film buried in the second trenches including the deposition-type silicon oxide film but excluding the coating-type silicon oxide film;
a second gate insulating film formed on the semiconductor substrate in the peripheral region; and
a second gate electrode of the peripheral circuit transistor formed on the second gate insulating film.

5. The semiconductor device according to claim 4, wherein an upper surface of the first element isolation insulating film is lower than an upper surface of the second element isolation insulating film.

6. The semiconductor device according to claim 5, wherein the first gate electrode includes a charge storage layer having an upper surface, the upper surface of the charge storage layer is higher than the upper surface of the first element isolation insulating film.

7. The semiconductor device according to claim 6, wherein the charge storage layer includes a polycrystalline silicon film.

8. The semiconductor device according to claim 4, wherein the deposition-type silicon oxide film includes a high density plasma (HDP) film.

9. The semiconductor device according to claim 4, wherein the coating-type silicon oxide film includes a polysilazane film.

10. The semiconductor device according to claim 4, wherein the deposition-type silicon oxide film includes a tetra-ethoxy-silane (TEOS) film.

11. The semiconductor device according to claim 10, further comprising a high density plasma (HDP) film formed on the TEOS film without the coating-type silicon oxide film.

* * * * *